United States Patent
Ryba

[11] Patent Number: 5,298,853
[45] Date of Patent: Mar. 29, 1994

[54] ELECTRICAL APPARATUS FOR DETECTING RELATIONSHIPS IN THREE PHASE AC NETWORKS

[76] Inventor: Lubos Ryba, Chodov 14900 CSFR, Bardskova 1566 Praha 4, Czechoslovakia

[21] Appl. No.: 992,793

[22] Filed: Dec. 18, 1992

[51] Int. Cl.$^5$ ............................................. G01R 19/14
[52] U.S. Cl. ........................................ 324/86; 324/108; 361/76
[58] Field of Search ............... 340/651; 324/86, 108; 361/76

[56] References Cited

U.S. PATENT DOCUMENTS

| | | | |
|---|---|---|---|
| 3,431,467 | 3/1969 | Calfee | 361/76 |
| 3,596,137 | 7/1971 | Kirsch | 361/76 |
| 3,764,904 | 10/1973 | Drexler | 361/76 |
| 4,495,461 | 1/1985 | Gilliam | 361/76 |
| 4,885,532 | 12/1989 | Macey | 361/76 |

FOREIGN PATENT DOCUMENTS

| | | | |
|---|---|---|---|
| 830608 | 5/1981 | U.S.S.R. | 324/86 |
| 1064234 | 12/1983 | U.S.S.R. | 324/86 |
| 1200205 | 12/1985 | U.S.S.R. | 324/86 |
| 1221618 | 3/1986 | U.S.S.R. | 324/86 |
| 1269056 | 11/1986 | U.S.S.R. | 324/86 |
| 1422190 | 9/1988 | U.S.S.R. | 324/86 |

Primary Examiner—Kenneth A. Wieder
Assistant Examiner—Jose M. Solis
Attorney, Agent, or Firm—Robert J. Black

[57] ABSTRACT

An electrical apparatus for visually indicating phase sequence, phase asymmetry and presence of three phases of an AC network comprising two transistors connected by their emitters to a first voltage terminal of the three phase network, the bases of the transistors being connected through diodes to a first voltage terminal and through crosscoupled phase shifting means to two other terminals of the three phase network. The collectors of the transistors are connected through resistors, light emitting diodes and diodes to two other voltage terminals and the emitters of the two transistors are connected through two other light emitting diodes to the first voltage terminal.

12 Claims, 2 Drawing Sheets

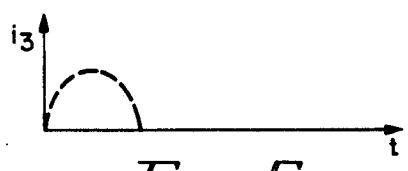
FIG_5
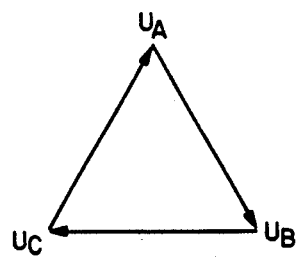
FIG_5b
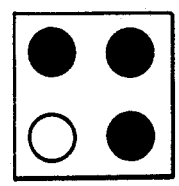
FIG_5c
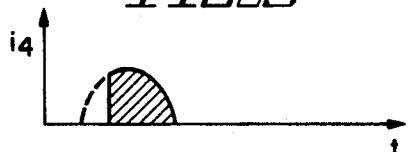
FIG_5a
FIG_6
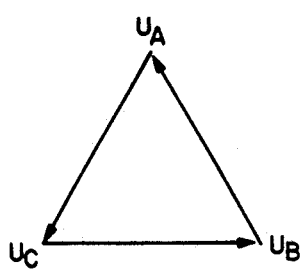
FIG_6b
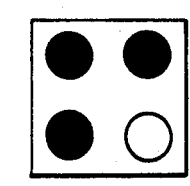
FIG_6c
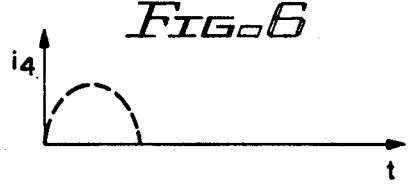
FIG_6a
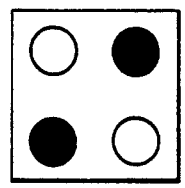
FIG_7
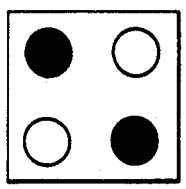
FIG_8
○ LED OFF
● LED ON
▒ LED PARTIALLY ON
FIG_9
FIG_10
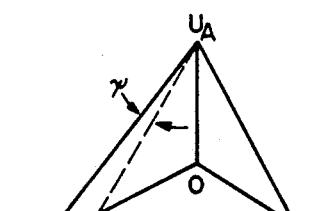
FIG_10b
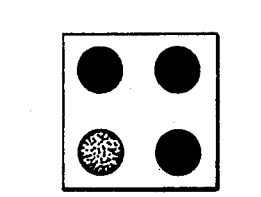
FIG_10c
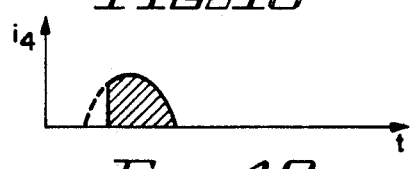
FIG_10a
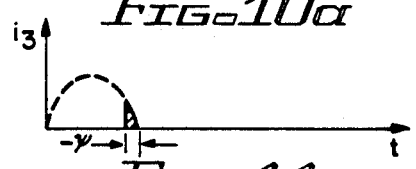
FIG_11
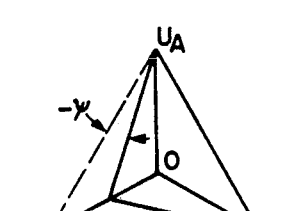
FIG_11b
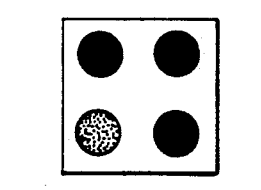
FIG_11c
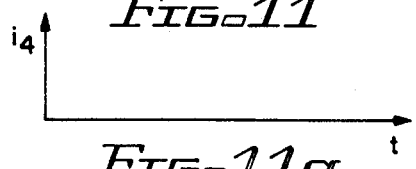
FIG_11a

ELECTRICAL APPARATUS FOR DETECTING RELATIONSHIPS IN THREE PHASE AC NETWORKS

BACKGROUND OF THE INVENTION

1. Field of the Invention

This invention relates to an electrical apparatus for detecting relationships in three phase AC networks and more particularly to an apparatus for determining phase sequence and detecting presence of all three phases in AC networks.

2. Background Art

The correct phase sequence is very important for three phase devices connected to an AC network because it determines the direction of rotation of asynchronous motors. Incorrect phase sequence would cause a backward rotation of such motors.

It may also happen, e.g., in complicated switchboards that the same phase can be connected twice instead of the third phase or even the zero wire can be connected instead of one phase.

Another important thing is to determine voltage differences between the three phases.

So, it is very important to determine the phase sequence, the presence of all three phases and their magnitude when different devices, e.g., main and subsidiary switchboards, motors, etc., are connected to an AC network. Measuring of these relationships are determined, in most cases, in the field. An apparatus for measuring or determining these relationships should be light, easy to carry and, last but not least, inexpensive.

Various devices are known for determining the correct phase sequence, presence of all three phases and voltage differences. Control devices for determining phase sequence contain small asynchronous motors, control devices with different lamps and induction measuring instruments, e.g., voltmeters.

The fundamental disadvantage of many of the above mentioned devices is caused by their large dimensions, resulting in only limited use in the field. Devices containing neon lamps have only a limited range of measurable voltages.

A device for indicating reverse phase sequence or single phase is described, for example, in U.S. Pat. No. 3,596,137 issued Jul. 27, 1971 which uses a silicon controlled rectifier (SCR) connected by its main current path between at least two phases of a measured polyphase network. In the case of a correct phase sequence, the SCR is switched on and the current flowing through it switches a relay. In the case of a reverse phase sequence, the SCR is not switched on as the firing circuit does not send a firing signal to the control electrode of the SCR. The disadvantage of this device is the need of a firing circuit and a relay indicating the correct phase sequence. The device is therefore rather bulky, complicated and expensive.

Another device called "Waveform Crossing Detector" is described in U.S. Pat. No. 4,495,461 issued Jan. 22, 1985. This device detects a pair of waveforms of a three phase AC supply and includes a pair of opto-couplers driven by respective transistors acting as actual crossing detectors. The transistors are driven by different phase sequences of a three phase network. Final signals are processed in logical circuits. The disadvantage of such device is that a stabilized power supply for feeding the logical circuits is necessary, causing large dimensions and higher price.

Another device for testing multiphase outlet with visual indication of phase energization, phase rotation and supply voltage is known from U.S. Pat. No. 4,885,532 issued Dec. 5, 1989. This device is intended for continuous measuring of an AC network as used in explosive and inflammable areas, e.g., in underground mines. The device, according to this invention, uses neon lamps indicating presence of each phase of a three phase AC system and the phase rotation direction. The device typically includes means to alter the safe handling voltage level from AC to DC and a voltmeter into which this direct current is applied. The voltage between phases is indicated by the voltmeter. As already mentioned above, this device is usually intended for purposes of continuous stationary measurements and not for measurements when a new or repaired AC device is connected to an AC three phase network where compact and small measuring apparatus are desired.

SUMMARY OF THE INVENTION

This invention provides an electrical apparatus for detecting relationships in three phase AC networks with the following advantages:

small dimensions
simple circuit with few parts
independent on an additional power supply
easy service and fast orientation
quick indication of presence of all three phases
quick indication of phase sequence
indication of voltage asymmetry of the three phase network
possibility to measure in wide range of voltages through a simple change or switching the proper resistors An apparatus according to this invention can be placed in a special case or due to its small dimensions even into other measuring devices or instruments. The apparatus uses four light emitting diodes in order to indicate the relationships in an AC network with three phases. The status of these diodes, i.e., if they are on, off or partially on is used for a clear determination of phase sequence, of presence of phases, and for voltage asymmetry.

The present invention consists of two transistors connected by their emitters to one voltage terminal of the measured three phase AC network. Bases of these transistors are connected through respective diodes also to said voltage terminal and through crosscoupling phase shifting means to the two other voltage terminals of said three phase AC network. Collectors of these transistors are connected through resistors, two light emitting diodes and two diodes to two other voltage terminals and the emitters of these transistors are connected through two different light emitting diodes and two additional diodes to said first voltage terminal.

Two of the light emitting diodes (LEDs) indicate the presence of voltages between the phases, two other LEDs correct or reverse phase sequence, single phase sequence and/or phase asymmetry. The apparatus according to the invention uses phase shifting of two phase waveforms caused by two crosscoupled RC members which control the bases of the two transistors connected by their collectors and emitters in main branches of the apparatus.

In case all three phases are present, three light emitting diodes will burn. Through their proper placing in the apparatus cover, a clear indication of phase sequence is possible. Only partial operation of a fourth light emitting diode in addition to the three light emitting diodes already operated indicates voltage asymmetry.

BRIEF DESCRIPTION OF THE DRAWINGS

By way of example, one embodiment of the apparatus according to this invention will be described with reference to the accompanying drawings wherein:

FIGS. 5 and 5a represent the current response through the light emitting diodes LED4 and LED3 when phase sequence is correct according to FIG. 5b and when all three phases are present, according to FIG. 5c the light emitting diodes LED1, LED2 and LED4 fully operated.

FIGS. 6 and 6a represent the current response through the light emitting diodes LED3 and LED4 when phase sequence is incorrect according to FIG. 6b and when the light emitting diodes LED1, LED2 and LED3 are fully operated according to FIG. 6c.

FIGS. 7 and 8 show a situation when one phase is missing, i.e., only two light emitting diodes are fully operated, the other two are off.

FIG. 9 represents a diagrammatic identification of light emitting diodes in the apparatus cover when they are off, when they fully operate and when they are partially operated.

FIGS. 10 and 10a and FIGS. 11 and 11a represent a situation when an asymmetrical voltage is present in separate phases according to FIGS. 10b and 11b and when according to FIGS. 10c and 11c three light emitting diodes are fully operated, the fourth one being partially operated.

DESCRIPTION OF THE PREFERRED EMBODIMENT

Figure 1:
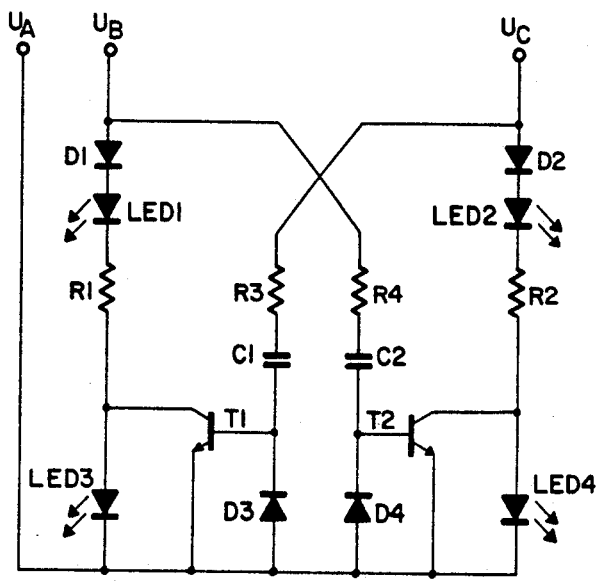
FIG. 1 is a circuit diagram of the apparatus of the present invention.
Figure 2:
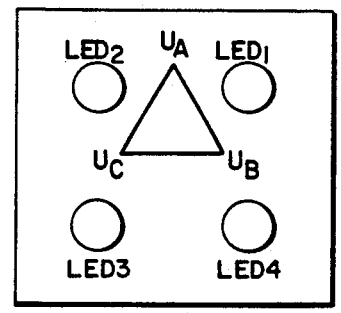
FIG. 2 shows a preferred embodiment of the apparatus cover, the light emitting diodes being placed to clearly indicate the phase sequence.

FIG. 1 illustrates an electrical schematic diagram of the preferred embodiment of the inventional apparatus. The apparatus consists of a first diode D1, the anode of which is connected to a voltage $U_B$ of a measured three phase electrical system. The cathode of the diode D1 is connected to an anode of a light emitting diode LED1 the cathode of which is through resistor R1 connected to the anode of light emitting diode LED3. Its cathode is connected to a voltage $U_A$ of the three phase electrical system. A collector of transistor T1 is connected to an anode of light emitting diode LED3. The emitter of transistor T1 is connected to the voltage $U_A$ of the three phase electrical system. The base of transistor T1 is connected to a cathode of diode D3, on the one hand, the anode of this diode being connected to said voltage $U_A$ of the three phase electrical system. The base of transistor T1 is connected, on the other hand, via a series connection of capacitor C1 and resistor R3 to voltage $U_C$ of the three phase electrical system. The apparatus further includes diode D2 the anode of which is connected also to voltage $U_C$ and the cathode of the diode D2 is connected to the anode of light emitting diode LED2. Its cathode is connected through a resistor R2 to the anode of light emitting diode LED4 the cathode of which is connected, as is the cathode of light emitting diode LED3, the emitter of the transistor T1 and the anode of the diode D3, to the voltage $U_A$ of the three phase electrical system. Also collector of transistor T2 is connected to the anode of the light emitting diode LED4, the emitter of the transistor T2 being connected to voltage $U_A$. The base of transistor T2 is connected to the cathode of diode D4, the anode of which is connected to the voltage $U_A$. The base of transistor T2 is connected to the cathode of diode D4 the anode of which is connected to the voltage $U_A$ of the three phase electrical system. The base of transistor T2 is also connected, via a series connection of capacotor C2 and resistor R4 to the voltage $U_B$ of the three phase electrical system.

NORMAL PHASE SEQUENCE

Figure 3B:
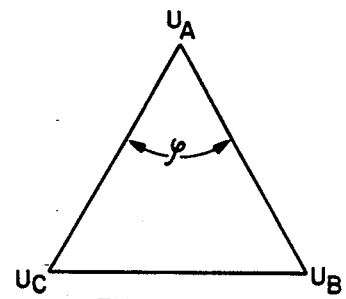
FIG. 3b shows a phase shifting angle $\phi$ between the voltages $U_B-U_A$ and $U_C-U_A$.
Figure 3A:
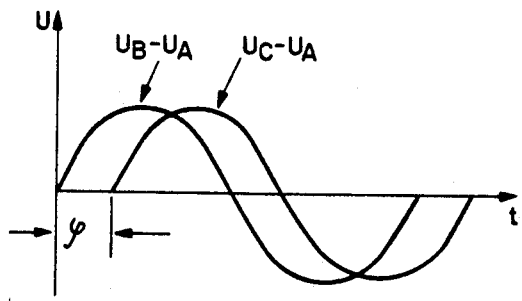
FIG. 3a shows the time sequence of voltages $U_B-U_A$ and $U_C-U_A$ shifted by an angle $\phi$.
Figure 4:
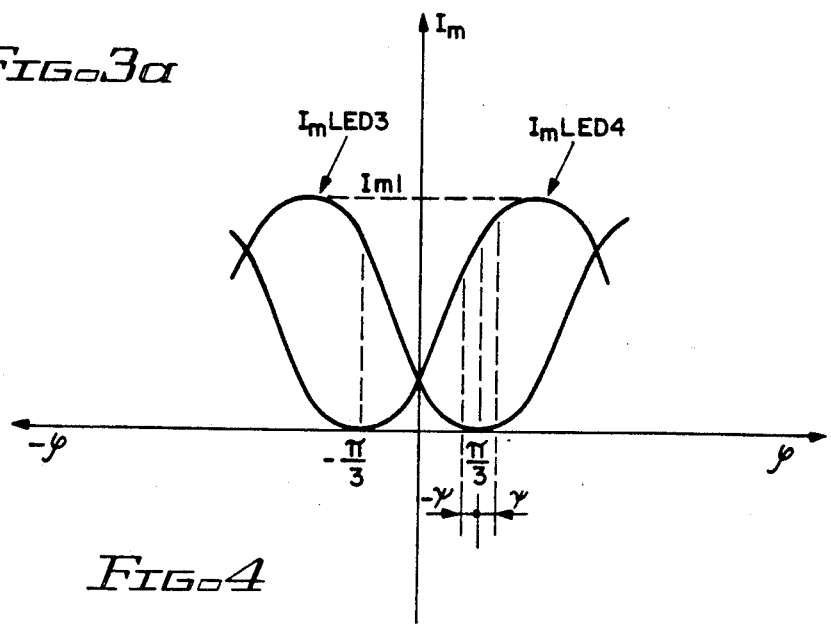
FIG. 4 represents the value dependency of medium currents flowing through light emitting diodes LED3 and LED4 on phase shifting $\phi$ between the voltages $U_B-U_A$ and $U_C-U_A$.

The apparatus is wired according to the diagram shown in FIG. 1. In the case of normal sequence of phases $U_A$, $U_B$, $U_C$, the timing of the voltage present on inputs of the apparatus is shown in FIG. 3a. The voltage $U_C-U_A$ is delayed relative to the voltage $U_B-U_A$ by a phase shift angle $\phi=60$ degrees. The phase shift angle $\phi$ between the voltages $U_B-U_A$ and $U_C-U_A$ is shown in FIG. 3b. Positive sine pulses of the voltage $U_B-U_A$ rectified by diode D1 flow through the first main branch of the apparatus, i.e., through diode D1, light emitting diode LED1, resistor R1 and light emitting diode LED3. The light emitting diode LED1 is operated indicating the presence of voltage $U_B-U_A$. The voltage $U_C-U_A$ is delayed relative to the voltage $U_B-U_A$ by a phase shift angle $\phi=60$ degrees, so that the current flowing through the first crosscoupled series member consisting of resistor R3 and capacitor C1 is shifted by 60 degrees forwards, i.e., in accordance with the response of the voltage $U_B-U_A$. The positive pulses flowing through this branch are passed through the base and the emitter of transistor T1, the negative pulses through diode D3. In view of the fact that the current pulses switching transistor T1 have the same time behaviour and form as current pulses flowing through the first main branch, switched transistor T1 prevents a current flow through light emitting diode LED3 which is off. The current response through light emitting diode LED3 is shown in FIGS. 5 and 5a.

Positive sine pulses of voltage $U_C-U_A$ rectified by diode D2 flow through the second main branch consisting of diode D2, light emitting diode LED2, resistor R2 and light emitting diode LED4. Light emitting diode LED2 is operated and indicates thereby presence of the voltage $U_C-U_A$. The voltage $U_B-U_A$ sweeps the voltage $U_C-U_A$ by a phase shift angle $\phi=60$ degrees and the current flowing through the second crosscoupled member consisting of resistor R4 and capacitor C2 is shifted by another 60 degrees so its response is relative to the voltage response $U_C-U_A$ shifted by 120 degrees. Positive sine pulses of this current flow through the base emitter junction of transistor T2, the negative pulses flow through diode D4. The positive pulses switching the transistor T2 are shifted by 120 degrees from sine pulses flowing through the second main branch. They prevent current flow through light emitting diode LED4. Only a small part of the pulse causes light emitting diode LED4 to operate. The current response through the light emitting diode LED4 is shown in FIG. 5a. When all three phases are present in a correct sequence, light emitting diodes LED1, LED2 and LED4 are operated so that as positioned on the apparatus cover (see FIG. 5c) they clearly indicate the phase sequence.

REVERSE PULSE SEQUENCE

The apparatus is wired according to FIG. 1. When a reverse phase sequence occurs as shown in FIG. 6b, the voltage $U_C$-$U_A$ is shifted relative to the voltage $U_B$-$U_A$ by phase shifting angle $\phi = -60$ degrees. In this case the current flowing through the second crosscoupled member consisting of the resistor R4 and the capacitor C2 has the same response as the current flowing through the second main branch consisting of diode D2, light emitting diode LED2, resistor R2 and light emitting diode D4 so that transistor T2 is controlled by pulses conforming to pulses flowing through said second main branch. It prevents thereby a current flow through light emitting diode LED4 which is off. On the contrary, light emitting diode LED3 is operated with respect to current low through the first crosscoupled member consisting of resistor R3 and capacitor C1 is shifted by 120 degrees relative to the current flowing through first main branch D1, LED1, R1, LED3. Transistor T1 is switched by positive pulses of this shifted current, it prevents a current flow through light emitting diode LED3 only in a small part of pulse (See FIG. 6) so that light emitting diode LED3 is operated. Also light emitting diodes LED1, LED2 which indicate presence of both voltages $U_B$-$U_A$, $U_C$-$U_A$ are operated. Totally, light emitting diodes LED1, LED2, LED3 are operated when a reverse phase sequence occurred so that being properly positioned in the apparatus cover (see FIG. 6c) they clearly indicate reverse phase sequence.

ONE PHASE MISSING

The apparatus is wired according to FIG. 1. Phase $U_C$ is missing in the three phase network. Only two light emitting diodes LED1, LED3 are operated. The LED1 indicates the presence of voltage $U_B$-$U_A$. The LED3 is operated as transistor T1 is not switched due to the missing phase $U_C$. When the phase $U_B$ is missing, only light emitting diodes LED2, LED4 are operated. The LED2 indicates the presence of voltage $U_C$-$U_A$. LED4 is operated as transistor T2 is not switched due to the missing phase $U_B$.

No LED operated if the phase $U_A$ is missing.

BIG VOLTAGE ASYMMETRY

The apparatus is wired according to FIG. 1. A large voltage asymmetry, as, shown in FIGS. 10b, 11b, is displayed as a deviation from a phase shift plus or minus 60 degrees due to the fact that the voltages do not form an equilateral triangle. In this case a fourth light emitting diode will be operated only partially and three other light emitting diodes will operate fully. The partial operation of the fourth diode occurs due to uncovered sine pulses of the respective light emitting diode (see FIGS. 10, 11, response $i_3$. Angles $\psi_1$-$\psi$ represent phase asymmetry.

IDENTICAL PHASE VOLTAGE ON TERMINALS

The apparatus is wired according to FIG. 1. The terminals $U_C$ and $U_B$ are connected to an identical voltage, therefore the phase shift between them $\phi = 0$ degrees. Both light emitting diodes LED3, LED4 are operated partially.

What is claimed is:

1. Electrical apparatus for detecting relationships in three phase AC networks, including a first transistor, the emitter of which is connected to a first voltage terminal and the base of which is connected to a cathode of a third diode, the anode of which is connected to said first voltage terminal and the collector of said first transistor is connected to an anode of a third light emitting diode, the cathode of which is connected to said first voltage terminal and the collector of said first transistor is connected to a first resistor, the second terminal of which is connected to a cathode of a first light emitting diode, the anode of which is connected to a cathode of a first diode, the anode of which is connected to a second voltage terminal, and including a first crosscoupled serial phase shifting means in order to shift phase forwards by 1/6th period of the input voltage between a third voltage terminal and said first voltage terminal, which is created by a third resistor and a first capacitor which are connected between the third voltage terminal and the base of said first transistor providing light intensity of the third light emitting diode, and including a second transistor, the emitter of which is connected to said first voltage terminal and the base of which is connected to a cathode of a fourth diode, the anode of which is connected to said first voltage terminal, the collector of said second transistor being connected to an anode of a fourth light emitting diode, the cathode of which is connected to said first voltage terminal and said collector of said second transistor being connected to a second resistor, the second terminal of which is connected to a cathode of a second light emitting diode, the anode of which is connected to a cathode of a second diode, the anode of which is connected to said third voltage terminal, and including a second crosscoupled serial phase shifting means in order to shift phase forwards by 1/6th period of the input voltage between said second voltage terminal and said first voltage terminal, which is created by a fourth resistor and a second capacitor which is connected between said second voltage terminal and the base of said second transistor providing light intensity of said fourth light emitting diode.

2. Apparatus according to claim 1 which is connected through its first, second and third voltage terminals to a three phase network for indicating phase sequence.

3. Apparatus according to claim 1 which is connected through its first, second and third voltage terminals to a three phase network for indicating phase asymmetry.

4. Apparatus according to claim 1 which is connected through its first, second and third voltage terminals to a three phase network for indicating presence of the three phases.

5. Electrical apparatus for detecting relationships in three phase AC networks comprising:
   first, second and third voltage terminals;
   a first circuit connection between said second voltage terminal and said first voltage terminal including first and third serially connected light emitting diodes;

a second circuit connection between said third voltage terminal and said first voltage terminal including second and fourth serially connected light emitting diodes;

a first transistor including a first circuit connection to said first voltage terminal;

a second circuit connection to said connection between said first and third light emitting diodes and first crosscoupled serial phase shifting means connected between said first transistor and said third voltage terminal;

a second transistor including a first circuit connection to said first voltage terminal;

a second circuit connection to said connection between said second and fourth light emitting diodes and a second crosscoupled serial phase shifting means connected between said second transistor and said second voltage terminal.

6. Electrical apparatus for detecting relationships in three phase AC networks as claimed in claim 5 wherein:
there is further included a first diode included in said first connection between said first light emitting diode and said second voltage terminal and a second diode included in said second circuit connection between said second light emitting diode and said third voltage terminal.

7. Electrical apparatus for detecting relationships in three phase AC networks as claimed in claim 5 wherein:
there is further connected a third diode between said first transistor and said first voltage terminal and a fourth diode between said second transistor and said first voltage terminal.

8. Electrical apparatus for detecting relationships in three phase AC networks as claimed in claim 5 wherein:
said first and said second first crosscoupling serial phase shift means each comprise a capacitor and resistor serially connected.

9. Electrical apparatus for detecting relationships in three phase AC networks as claimed in claim 5 wherein:
said apparatus is connected to a three phase AC network and response to the detection of normal phase sequency between in said network, and first, second and fourth light emitting diodes are operated.

10. Electrical apparatus for detecting relationships in three phase AC networks as claimed in claim 5 wherein:
said apparatus is connected to a three phase AC network and response to detection of incorrect phase sequence said first, second and third light emitting diodes are operated.

11. Electrical apparatus for detecting relationships in three phase AC networks as claimed in claim 5 wherein:
said apparatus is connected to a three phase AC network and response to detection of a missing phase said first and third light emitting diodes are operated, or in the alternative, said second and fourth light emitting diodes are operated.

12. Electrical apparatus for detecting relationships in three phase AC networks as claimed in claim 5 wherein:
said apparatus is connected to a three phase AC network and response to detection of an asymmetrical voltage of separate phases of said connected network, said first, second and fourth light emitting diodes are operated and said third light emitting diode is partially operated.

* * * * *